United States Patent
Ishikura et al.

(10) Patent No.: US 6,383,050 B1
(45) Date of Patent: May 7, 2002

(54) PROCESS FOR FORMING NON-EVAPORATIVE GETTER AND METHOD OF PRODUCING IMAGE FORMING APPARATUS

(75) Inventors: Junri Ishikura, Kawasaki; Ihachiro Gofuku, Chigasaki; Mitsutoshi Hasegawa, Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/481,561

(22) Filed: Jan. 11, 2000

(30) Foreign Application Priority Data

Jan. 13, 1999 (JP) ............................................ 11-006940

(51) Int. Cl.$^7$ ................................................. H01J 9/39
(52) U.S. Cl. .............................................. 445/41; 445/24
(58) Field of Search ............................... 445/24, 41, 55

(56) References Cited

U.S. PATENT DOCUMENTS

| | | | | |
|---|---|---|---|---|
| 3,657,784 A | * | 4/1972 | Selman et al. ................ | 65/374 |
| 4,120,700 A | * | 10/1978 | Morimoto .................... | 438/96 |
| 4,515,668 A | | 5/1985 | Brownell et al. ........... | 204/192 |
| 5,453,659 A | | 9/1995 | Wallace et al. .............. | 313/495 |
| 5,934,964 A | * | 8/1999 | Carella et al. ............... | 445/25 |
| 5,935,331 A | * | 8/1999 | Naka et al. .................. | 118/319 |
| 6,096,133 A | * | 8/2000 | Yuuki et al. ................. | 118/712 |

FOREIGN PATENT DOCUMENTS

| | | |
|---|---|---|
| EP | 0 455 162 | 11/1991 |
| EP | 0 586 756 | 3/1994 |
| EP | 95/23425 | 8/1995 |
| EP | 0 719 609 | 7/1996 |
| JP | 63-181248 | 7/1988 |
| JP | 1-235152 | 9/1989 |
| JP | 4-12436 | 1/1992 |
| JP | 4-289640 | 10/1992 |
| JP | 5-151916 | 6/1993 |
| JP | 7-235255 | 9/1995 |
| JP | 8-225806 | 9/1996 |

* cited by examiner

Primary Examiner—Kenneth J. Ramsey
(74) Attorney, Agent, or Firm—Fitzpatrick, Cella, Harper & Scinto

(57) ABSTRACT

The invention provides a getter of high performance capable of immediately absorbing a gas generated in an image forming apparatus, and an image forming apparatus exhibiting little luminance variation with the lapse of time and little luminance fluctuation. It also provides a method for producing a getter at a low temperature not effecting other components and in an arbitrary position in a simple manner with a low cost, thereby being adaptable to various processes. The invention relates to a process for forming a non-evaporative getter by a gas deposition method, and to a method of producing an image forming apparatus provided with an electron source, an image forming member for forming an image by irradiation with an electron beam emitted from the electron source, and a non-evaporative getter in a container, which comprises forming the non-evaporative getter by the above-mentioned process for forming the non-evaporative getter.

7 Claims, 10 Drawing Sheets

STRIPE

FIG. 6B

MATRIX

PROCESS FOR FORMING NON-EVAPORATIVE GETTER AND METHOD OF PRODUCING IMAGE FORMING APPARATUS

BACKGROUND OF THE INVENTION

1. Field of the Invention

The present invention relates to a method of producing an image forming apparatus provided with an electron source and an image forming member (for example, fluorescent substance) for forming an image by irradiation with an electron beam emitted from the electron source, in a vacuum container, and to a process for forming a getter for use in such image forming apparatus.

2. Related Background Art

In an apparatus for displaying an image by irradiating a fluorescent substance constituting an image display member with an electron beam emitted from an electron source to cause light emission of the fluorescent substance, the interior of the vacuum container containing the electron source and the image forming member has to be maintained at high vacuum. This is because, if the pressure in the vacuum container is elevated by gas generation, although the effect extent of the gas is different depending to the kind of the gas, such gas disadvantageously affects the electron source to lower the amount of emitted electrons, whereby bright image display cannot be attained. Also the generated gas may be ionized by an electron beam to generate ions and the ions are accelerated by the electric field for accelerating electrons to collide with the electron source, thereby leading to the destruction of the apparatus.

The vacuum container of the image display apparatus is generally formed by combining glass members and adhering the joint portions thereof with frit glass or the like, and once the adhesion is completed, the internal pressure is maintained by a getter provided in the vacuum container.

In the ordinary cathode ray tube (CRT), an alloy composed of Ba as a main component is heated by supplying an electric current or a high frequency wave in the vacuum container to form an deposited film on the inside wall of the container, and high vacuum state is maintained by absorbing the internally generated gas with the deposited film.

On the other hand, there is being developed a plat panel display employing an electron source and a plurality of electron emitting devices arranged on a plat substrate. In such apparatus, the volume of the vacuum container becomes smaller in comparison with that of the CRT while the area of the gas-emitting wall does not decrease, so that the gas generation of a similar level results in a larger rise in the pressure in the container, thereby causing a severer influence.

Also in case of CRT, the vacuum container is provided therein with sufficient wall portions where the electron source or the image display member is absent, and the above-mentioned getter material can be deposited on such wall portions. On the other hand, in case of the flat panel display, the internal wall of the vacuum container is mostly occupied by the electron source and the image forming member. When the deposited-type getter film is attached on the occupied area to cause disadvantageous effects such as short-circuit of the wirings, so that the location of the getter film to be formed is limited.

For this reason, there has been considered utilizing the corner or the like of the vacuum container as the area for forming the getter film, thereby avoiding the deposition of the getter material on the portion constituted by the image forming member and the electron source (hereinafter, referred to as "image display area"). But, if the flat panel display exceeds a certain size, there cannot be secured a sufficient area of the deposited getter film in comparison with the gas discharge amount.

Figure 3:
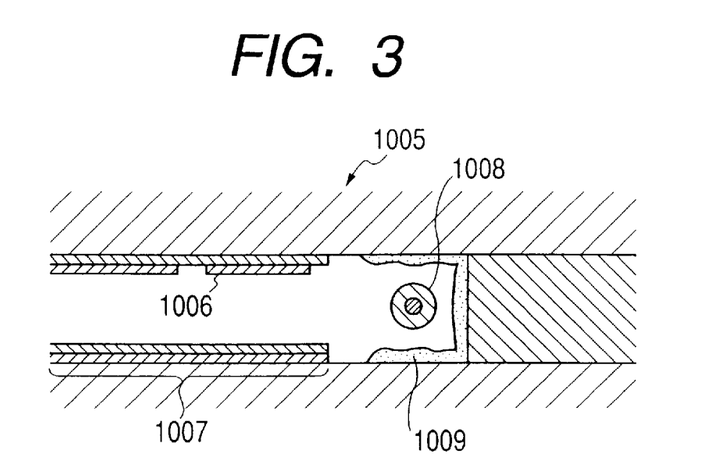
FIG. 3 is a cross-sectional view showing a getter treatment in a conventional flat image display apparatus.
Figure 4:
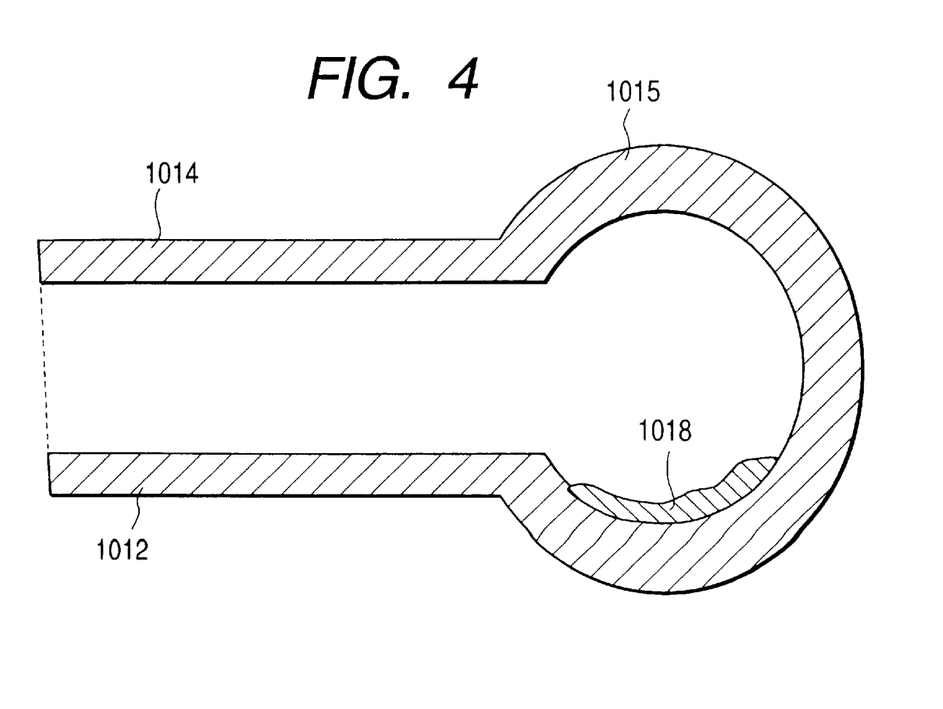
FIG. 4 is a cross-sectional view showing a getter treatment in another conventional flat image display apparatus.

In order to solve the above drawbacks and to secure a sufficient area of the getter, there has been proposed a method (Japanese Patent Application Laid-Open No. 5-151916) of providing, as shown in a cross-sectional view of FIG. 3 showing a portion concerning the getter treatment of a conventional flat image display apparatus, a wire getter 1008 on an outside, for example, along the external peripheral portions, of the image display area between a fluorescent substance 1006 and a field emission device 1007 provided opposite to each other in an external container 1005, thereby depositing and forming a getter film 1009 on the side surface of the external peripheral portion, a method (Japanese Patent Application Laid-Open No. 4-289640) of attaching, as shown in a cross-sectional view of FIG. 4 showing a portion concerning a getter treatment of a conventional flat image display apparatus, a getter chamber 1015 containing a getter material 1018 for forming the getter film, at a side of a space formed by a face plate 1014 and a rear plate 1012, and a method (Japanese Patent Application Laid-Open No. 1-235152) of providing a space between an electron source substrate and a rear plate of a vacuum container and forming the getter material therein.

In addition to the aforementioned drawbacks, the gas generation in the vacuum container of the flat image display apparatus causes a drawback that a pressure easily increases in a local position. In the image display apparatus having the electron source and the image display member, the gas generation in the vacuum container principally takes place in the image display area irradiated with the electron beam.

In the conventional CRT, since the image display member and the electron source are mutually separated and the getter film formed on the internal wall of the vacuum container is positioned therebetween, the gas generated in the image display member widely diffuses until is reaches the electron source, and a part of the gas is adsorbed by the getter film, so that the pressure does not rise extremely at the position of the electron source. Also an extreme local pressure rise is not caused by the gas discharged from the electron source itself, since the getter film is also provided around the electron source.

In the flat image display apparatus, however, the image display member and the electron source are closely positioned, so that the gas generated from the image display member reaches the electron source before diffusing sufficiently, thereby inducing a local pressure rise. Particularly in the central portion of the image display area, the local pressure rise tends to appear larger in comparison with the peripheral portion, because the gas cannot diffuse to the area of the getter film. The generated gas is ionized by the electrons emitted from the electron source, thereby causing damage between the electron source and the image display member or inducing a discharge to destroy the electron source.

In consideration of the foregoing, there is already disclosed a constitution of the flat image display apparatus having a specified structure, which comprises positioning a getter material in the image display area and immediately absorbing the generated gas. For example, Japanese Patent Application Laid-Open No. 4-12436 discloses a method, in an electron source having a gate electrode for taking out the electron beam, of forming the getter electrode with a getter material, and illustrates an electron source of field emission type having a conical projection as the cathode and a semiconductor electron source having a pn junction. Also, Japanese Patent Application Laid-Open No. 63-181248 discloses a method, in a plat panel display provided with an electrode (for example, grid) for controlling the electron beam between a group of cathodes and a face plate of the vacuum container, of forming a film of getter material on such control electrode.

Also, U.S. Pat. No. 5,453,659, entitled by "Anode plate for flat panel display having integrated getter", issued on Sep. 26, 1995 to Wallace et al. discloses a structure of forming a getter member in the gap between the fluorescent substances on the stripes formed on the image display member (anode plate). In this example, the getter material is electrically separated from the fluorescent substance and the conductive member electrically connected thereto, and the getter is activated by giving a suitable potential to the getter and irradiating and heating the getter with the electrons emitted from the electron source.

The electron emitting device for use as the electron source in the flat panel display should naturally be simple in the structure and the producing method, in consideration of the production technology and the production cost. With respect to these points, the aforementioned electron source having the getter electrode formed of the getter material, disclosed in Japanese Patent Application Laid-Open No. 4-12436, requires complicated steps in the vacuum apparatus for forming the control cathode chip or for forming the semiconductor junction, and is limited in size by the production apparatus.

Also the apparatus having the control electrode etc. between the electron source and the face plate as disclosed in Japanese Patent Application Laid-Open No. 63-181248 is complicated in structure and involves complicated steps such as alignment of these components in the manufacture. Also the getter disclosed in Japanese Patent Application Laid-Open No. 8-225806 is formed by compressing the mixture of metal powder for forming the getter and a powdered organic compound and then sintering the compressed mixture at about 1000° C. in vacuum or in inert gas, and therefore cannot be provided within the display panel in consideration of pressure and temperature required.

Also in the method of forming the getter material on the anode plate, disclosed in U.S. Pat. No. 5,453,659, the getter material and the fluorescent substance have to be electrically insulated, and the precise fine work is required for the above formation, and patterning by photolithographic technology is repeated. The above process therefore becomes complex, and the size of the apparatus to be employed for photolithography is limited.

The electron emitting device capable of satisfying the aforementioned requirement of easy production process can includes the lateral-shaped electron emitting device of field emission type and the electron emitting device of surface conduction type. The lateral-shaped electron emitting device of field emission type is composed, on a flat substrate, of a cathode having a pointed electron emitting portion and an opposed anode for applying a high electric field to the cathode, and can be produced by thin film deposition technology such as evapor deposition, sputtering or plating and ordinary photolithography. The electron emitting device of surface conduction type emits electrons by passing a current to a conductive film having a high resistance portion in one portion thereof, and an example of such device is disclosed in Japanese Patent Application Laid-Open No. 7-235255.

Since the electron source using these devices does not have the gate electrode of the shape as disclosed in Japanese Patent Application Laid-Open No. 4-12436 or the control electrode of the shape as disclosed in Japanese Patent Application Laid-Open No. 63-181248, the getter is to be provided outside the image display area by a method similar to those disclosed in these applications.

As already explained in the foregoing, the most significant source of gas generation is the image display member such as the fluorescent film receiving the impact of electrons of high energy, and the electron source itself. Naturally, gas generation can be prevented if there can be executed sufficient degassing by baking for a prolonged period at a high temperature or the like. In the practical apparatus, however, sufficient degassing can not be executed in some cases since the electron emitting device and other components are damaged thermally, so that the gas generation is highly probable.

In case the pressure of the generated gas is a relatively low, in addition to the influence on the electron emitting characteristics which is caused by absorption of the gas on the electron emitting portion of the electron source, it is afraid that the gas molecules ionized by the potential emitted by the electron source are accelerated by the electric field formed by the voltage applied between the image display member and the electron source or between the positive electrode and negative electrode of the electron source, and then collide with the positive electrode or negative electrode of the electron source, thereby causing damage thereon.

Also in case the gas pressure is elevated locally or instantaneously, it is afraid that the ions accelerated by the electric field collide with other gas molecules to generate ions in succession and eventually induce a discharge. In such case, it is afraid that the electron source is partially broken, resulting deterioration of the electron emitting characteristics. Also the gas generation from the image display member is caused by abrupt release of gas, such as $H_2O$, $H_2$, $CH_4$, $CO$, $CO_2$, $O_2$ etc., contained in the fluorescent substance when electrons are emitted to conduct the light radiation of fluorescent substance after the image display apparatus is completed. Such gas generation may result in a phenomenon of evident drop of the image luminance in the initial driving stage of the apparatus.

By continuing the driving thereafter, gas is generated also from the area around the electron source, whereby the characteristics gradually deteriorate. In the conventional case where the getter area is provided outside the image display area, the gas generated in the central portion of the image display area not only requires a time for reaching the outside getter area but also is re-adsorbed by the electron source before being absorbed by the getter, whereby the getter is unable to be effective enough for preventing the deterioration in the electron emitting characteristics and the decrease of the image luminance may become conspicuous particularly in the center of the image display area.

Consequently, in the flat image display apparatus of the structure without the gate electrode or control electrode, there has been desired a novel structure in which the getter member can be positioned within the image display area so that a generated gas is rapidly removed. It has also been desired to form the getter at a low temperature, in consideration of the damage to the components in the vicinity of the getter member.

SUMMARY OF THE INVENTION

In consideration of the foregoing, an object of the present invention is to provide an image forming apparatus capable of solving the aforementioned drawbacks, particularly an image forming apparatus equipped with a getter of high performance, less variation in luminance with the lapes of time and less luminance fluctuation. Another object of the present invention is to provide a process for forming a getter at a low temperature that does not damage other elements and at an arbitrary position in a simple manner with a low cost, thereby being adaptable to various processes.

According to the present invention, there is provided a process for forming a non-evaporative getter, comprising forming the non-evaporative getter by a gas deposition method.

According to the present invention, there is provided a process for forming a non-evaporative getter, which comprises generating metal particles by heating in an inert gas atmosphere in a particle generating chamber, conveying the metal particles through a conveying pipe to a film forming chamber by a pressure difference and discharging the metal particles onto a substrate to form the non-evaporative getter on the substrate.

According to the present invention there is also provided a method of producing an image forming apparatus provided with an electron source, and an image forming member for forming an image by irradiation with an electron beam emitted from the electron source, and a non-evaporative getter in a container, which comprises forming a non-evaporative getter by a gas deposition method.

According to the present invention, there is further provided a method of producing an image forming apparatus provided with an electron source, an image forming member for forming an image by irradiation with an electron beam emitted from the electron source and a non-evaporative getter in a container, which comprises forming the getter on a substrate by generating metal particles by heating in an inert gas atmosphere in a particle generation chamber, conveying the metal particles through a convey pipe to a film forming chamber by a pressure difference, and discharging the metal particles onto the substrate.

DETAILED DESCRIPTION OF THE PREFERRED EMBODIMENTS

The present invention will be described below in detail by preferred embodiments thereof.

The particle size defining "ultra-fine particles" is several tens to several hundred Angstroms in the primarily generated particles, and is up to about 1 $\mu$m in the secondarily or tertially generated particles. The conglomerates of primarily, secondarily or tertially generated ultra-fine particles having a particle size up to about 1 $\mu$m are called "ultra-fine powder" (Vacuum Handbook, published by Japan Vacuum Technology Co.).

Such ultra-fine particles or ultra-fine powder having a smaller particle size and therefore an enormously larger specific surface area in comparison with the ordinary fine particles is expected to have a high absorption rate. The present invention is to employ a gas deposition method for forming the ultra-fine particles and ultra-fine powder.

The gas deposition method is a dry film forming method employing an apparatus consisting of an ultra-fine particle generation chamber, a film forming chamber and a conveying pipe and the like, wherein ultra-fine metal particles are generated in the ultra-fine particle generation chamber by arc discharge, resistance heating or the like in an inert gas atmosphere, the metal particles are conveyed to the film forming chamber through the conveying pipe by a pressure difference and the metal particles are discharged at a high speed from a nozzle, thereby directly drawing a pattern (Iwashige et al., 17C-12 11th Academic Conference on Circuit Formation).

In the following there will be explained the features of the non-evaporative getter formed by the gas deposition method.

At first, in a preferred embodiment, the non-evaporative getter of the present invention is composed of Zr, Ti or an alloy containing at least one of Zr and Ti as a main component and further containing at least one of Al, V and Fe as an auxiliary component.

In the gas deposition method, the pressure difference, substrate temperature, gas species etc. can be varied to adjust the particle size, packing, density etc. of the formed ultra-fine particle film, thereby forming ultra-fine powder as conglomerates thereof. Since these parameters are factors determining the getter characteristics, it is possible to control the getter characteristics to a certain degree by optimizing the film forming conditions.

Also, since the ultra-fine particles can be formed at a low temperature, the gas deposition method not only significantly improves the production tact but also suppresses the damage to the substrate and other components. On the other hand, the sintering method results in a significant damage to the peripheral elements since the powder after compressing has to be heated close to the melting temperature thereof. Also the gas deposition method allows to directly form the non-evaporative getter without an adhesive agent, which is indispensable in the adhesion method. Consequently the peripheral elements can be protected from the influence of gas discharged from the adhesive agent.

Also the gas deposition method in which all the formed ultra-fine particles are basically used as raw materials has a very high efficiency of material utilization. On the other hand, in the sputtering method or vacuum evaporation method, the efficiency of material utilization is about 5% at most.

Also in contrast to the sputtering method and vacuum evaporation method which requires masking at the film formation or patterning after the film formation and which are therefore limited in the position of getter formation, the gas deposition method is a directly drawing method and can form the non-evaporative getter in an arbitrary position. Therefore, it can significantly contribute to reduction of the number of production steps and the production cost. In particular, since the gas deposition method can limit the film formation to a very small area by regulating the conditions such as the nozzle diameter and the nozzle-substrate distance, the getter can be formed in a very small area. Particularly, by forming the getter within the image display area such as on the wirings or on the black matrix, the gas absorption layer can be formed with a larger area, in the vicinity of the location where the gas generation amount is largest, whereby the gas generated in the external container can be rapidly absorbed in the getter layer. Thus the interior of the external container can be maintained in a satisfactory vacuum level and the amount of electron emission from the electron source can be stably maintained.

In the following the present invention will be further described with reference to examples thereof.

EXAMPLE 1

Figure 1:
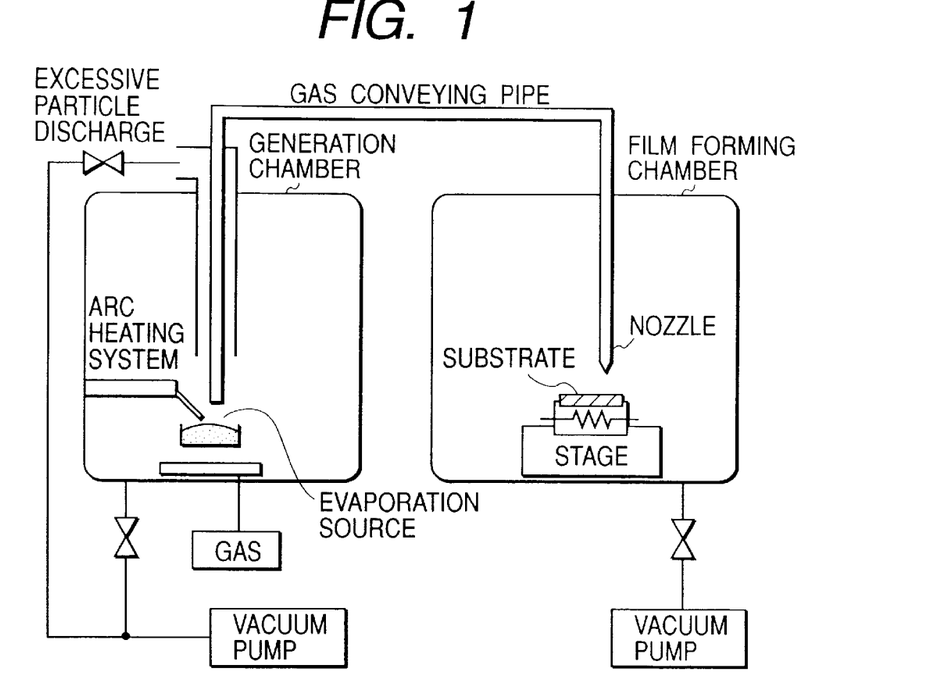
FIG. 1 is a schematic view showing a jet printing method employed in the example of the present invention.

In this example, the film formation for the non-evaporative getter consisting of ultra-fine particles was executed with a jet printing system of Shinku Yakin Co. FIG. 1 is a schematic view of the jet printing system employed in the present example. The film forming system is composed of an ultra-fine particle generation chamber, a film forming chamber, a conveying pipe etc. Ultra-fine metal particles are generated in the ultra-fine particle generation chamber by heating an alloy constituting the evaporation source by an arc heating device in an inert gas atmosphere, and then are conveyed into the film forming chamber through the conveying pipe by a pressure difference, and further are discharged at a high speed from a nozzle.

In the present example, Zr and V chips were mixed with a weight ratio of 99.5:0.5 in a crucible in the ultra-fine particle generation chamber and were fused by arc heating to obtain an alloy. An arc current within a range of 40 to 150 A was adequate for obtaining a high fusing rate and for efficiently conveying the generated ultra-fine particles into the conveying pipe. In the present example, there was selected an arc current of 150 A.

It is possible to use a carrier gas such as He, Ar or a mixture thereof, which is eventually added with nitrogen. In case of producing of film composed of a high-fusing material such as Zr as a main component employed in the present example, He is desirable since other carrier gas tends to generate conglomerates and lead to the loss of the adhesive strength. The present example employed He of a purity of 99.9999% as the carrier gas. Also the internal pressure of the ultra-fine particle generation chamber at the film formation is desirably less than 2 atm., since a pressure of 2 atm. or more tends to generate conglomerates and lead to the loss of the adhesive strength. In the present example, the pressure was selected as 1 atm. The nozzle had an internal diameter of 1 mm and was maintained at a distance of 3 mm from the substrate. Heating mechanisms were provided in the nozzle and the conveying pipe, in order to avoid generation of the conglomerates.

The ultra-fine particles discharged through the gas conveying pipe were deposited to form a film of ultra-fine particles on a nichrome substrate. The nozzle was fixed while a stage for supporting the substrate was rendered movable in x, y, z and θ directions. In the present example, the stage was moved only in the x-direction, whereby a line-shaped ultra-fine particle film of a size of 50 mm×1 mm and a thickness of 20 μm was formed on the substrate (sample 1). In this operation, the substrate was maintained at a temperature of 150° C.

Figure 2:
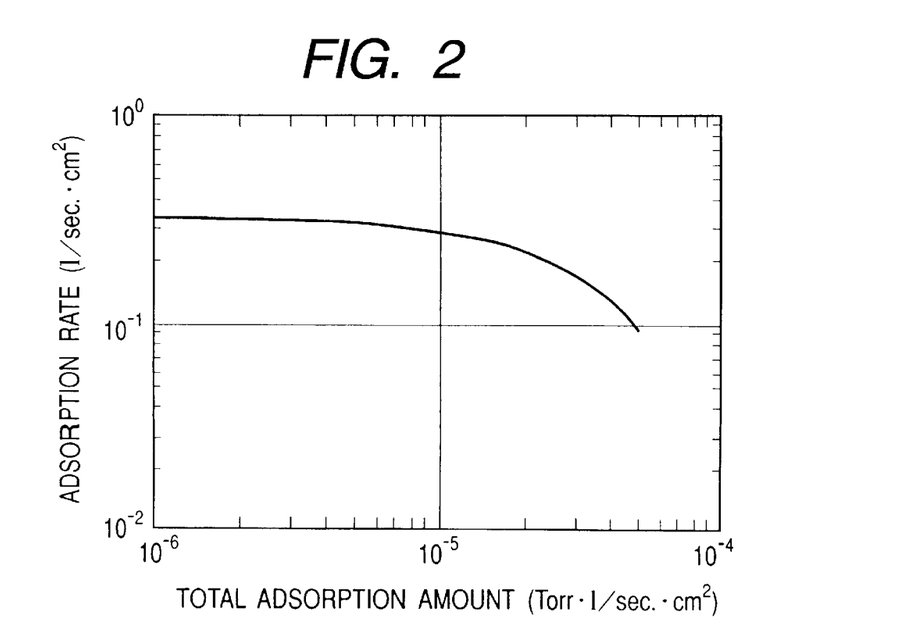
FIG. 2 is a graph showing the absorption characteristics of a getter formed in the example of the present invention.

The sample thus obtained was activated for 10 minutes at 500° C. and then subjected to the measurement of gas adsorption rate and adsorption volume at room temperature. The measurement was executed with the throughput method employing CO as the measuring gas. FIG. 2 shows the result of measurement of the adsorption characteristics of the getter. The adsorption characteristics were confirmed from FIG. 2. As comparative examples, a sample formed by sputtering a material of same composition (Zr/V=99.5/0.5 wt. %) (sample 2), and a sample formed by fusion injection of a getter St122 (Zr-V-Fe-Ti) of Saes Getters Co. (sample 3) were activated under the same condition and subjected to the measurement of the initial adsorption characteristics. The obtained results are shown in Table 1. In the initial adsorption characteristics, the sample of the present example was inferior to St122 but comparable to the sputtered film.

TABLE 1

| Sample | Initial adsorption rate (1/sec · cm²) |
|--------|---------------------------------------|
| 1      | 0.35                                  |
| 2      | 0.35                                  |
| 3      | 0.70                                  |

EXAMPLE 2

The getter formed under the same conditions as those of Example 1 was incorporated into an image display apparatus.

Figure 5:
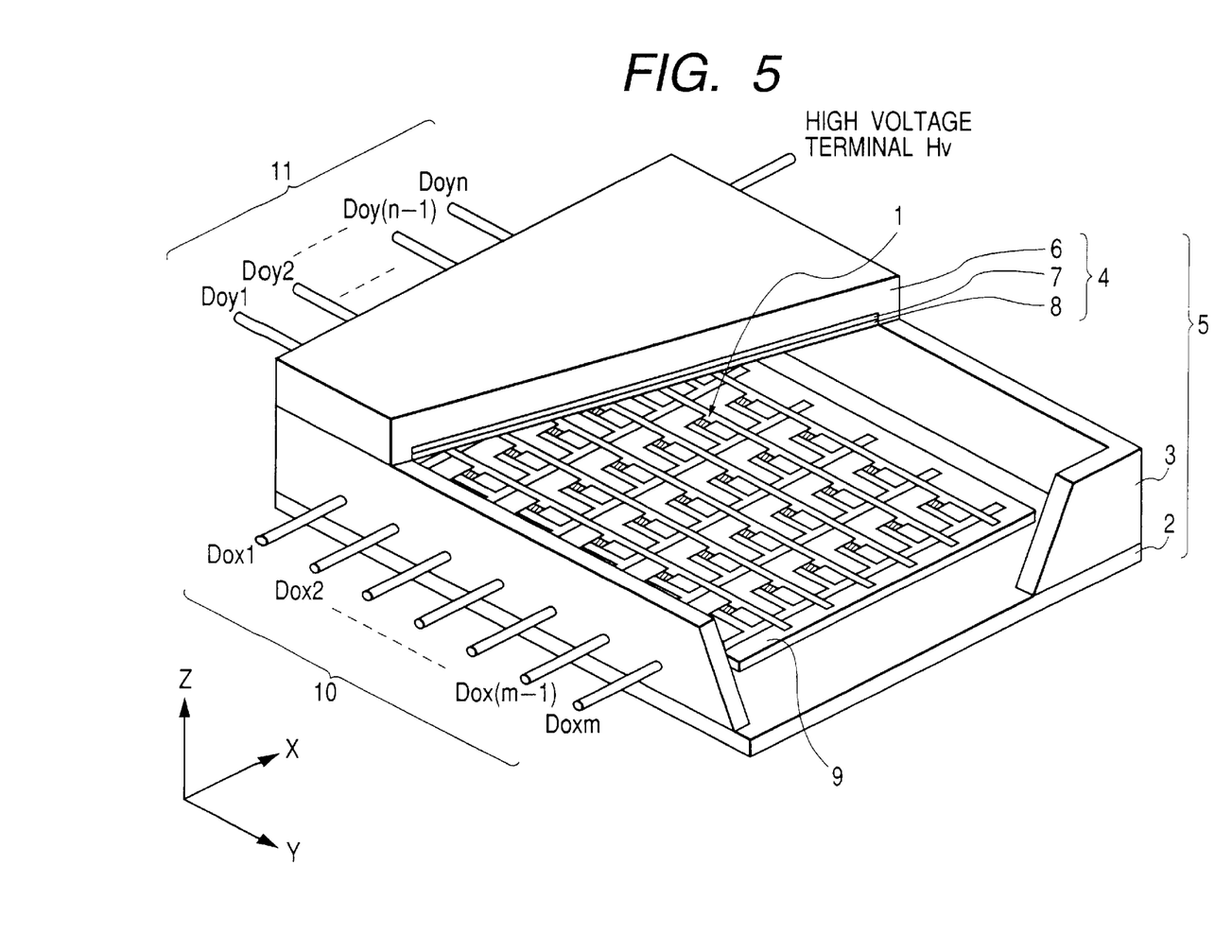
FIG. 5 is a partially cut-off perspective view of an external container according to an embodiment of the image forming apparatus of the present invention.

In the following there will be explained the steps of incorporating the getter into the image display apparatus. The image display apparatus of the present example has the same structure as that schematically shown in FIG. 5. FIG. 5 shows an electron source 1, a rear plate 2, a supporting frame 3, an image forming member 4, an external container 5, a glass substrate 6, a fluorescent film 7, a metal back 8, a getter 9, and X-direction wiring 10, and a Y-direction wiring 11. The image display apparatus of the present example is provided with an electron source having a plurality of electron emitting devices (100 rows×300 columns) of surface conduction type wired in a simple matrix state on a substrate, and the getter layer is formed on the wirings.

Figure 7:
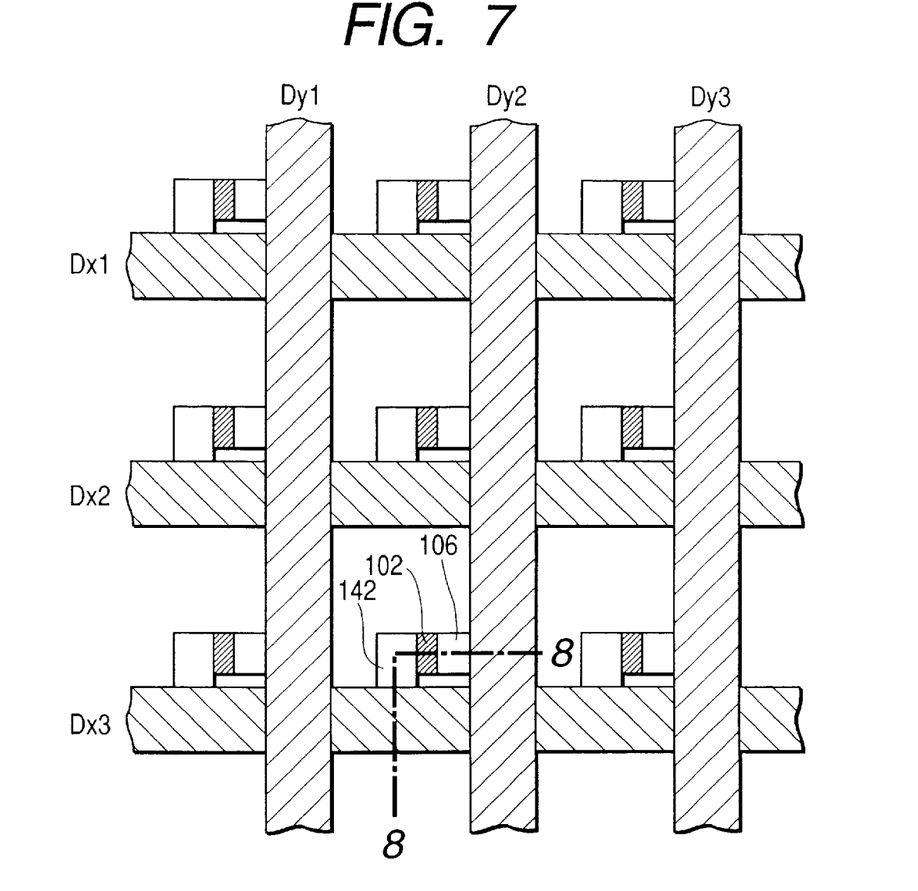
FIG. 7 is a schematically plan view of an electron source in which a plurality of electron emitting devices of surface conduction type are connected in a matrix.
Figure 8:
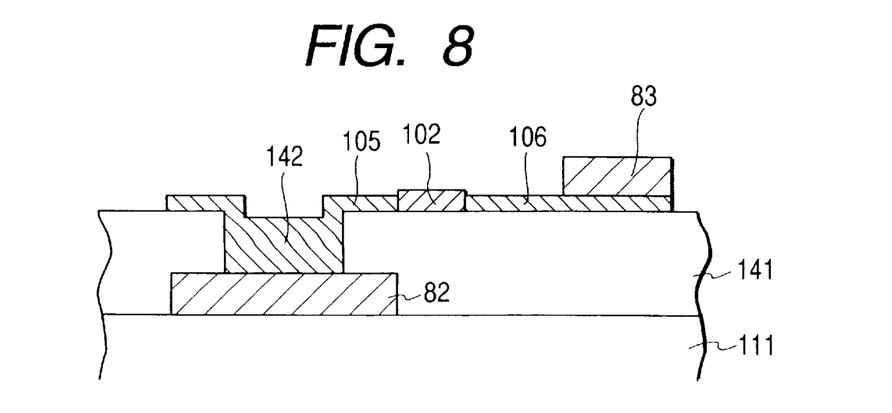
FIG. 8 is a cross-sectional view taken along a line 8—8 of FIG. 7.

FIG. 7 is a partial plan view of the electron source, and FIG. 8 is a cross-sectional view taken along a line 8—8 in FIG. 7. The same component is represented by the same number in FIGS. 7 and 8, wherein shown are an electron source substrate 111, an X-direction wiring (lower wiring) 82 corresponding to Doxm in FIG. 5, a Y-direction wiring (upper wiring) corresponding to Doyn in FIG. 5, a conductive film 102 including an electron emitting portion, device electrodes 105 and 106, an interlayer insulation film 141, and a contact hole 142 for electrically connecting the device electrode 105 and the lower wiring 82.

In the following there will be explained, with reference to FIGS. 9A to 9D and 10E to 10H, the method for producing the image display apparatus of the present example.

<Step a>

Figure 9A:
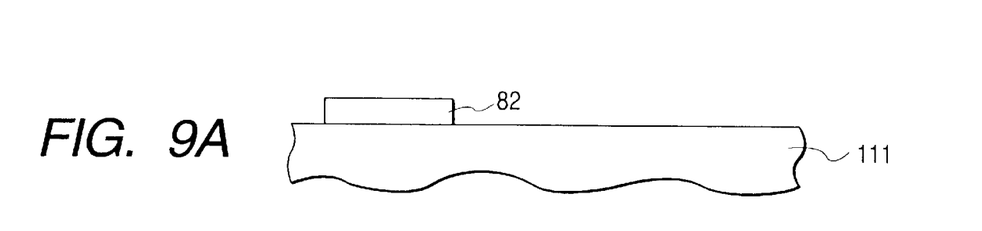
FIGS. 9A, 9B, 9C and 9D are views showing steps for producing the electron source shown in FIG. 7.

On an electron source substrate 111 which is formed by sputtering a silicon oxide film of a thickness of 0.5 μm on a cleaned glass plate, there were deposited in succession Cr with a thickness of 5 nm and Au with a thickness of 600 nm by vacuum evaporation. Then photoresist (ZA1370 produced by Hoechst Co.) was spin coated, baked, exposed to a photomask pattern and developed to form a resist pattern of the lower wiring 82, and the Au/Cr deposited films were wet etched to form the lower wiring 82 of the desired shape (FIG. 9A).

<Step b>

Figure 9B:
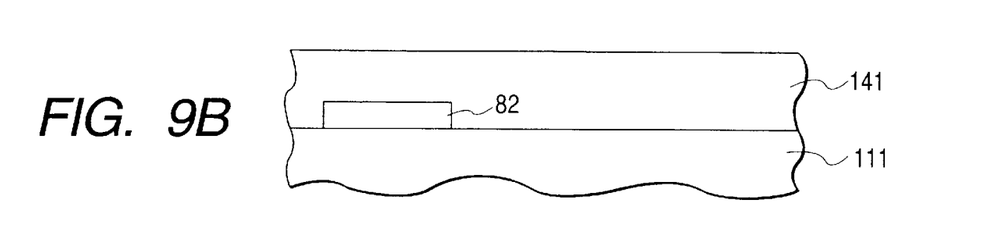

Then the interlayer insulation film 141 consisting of a silicon oxide of a thickness of 20 μm was deposited by RF sputtering (FIG. 9B).

<Step c>

Figure 9C:
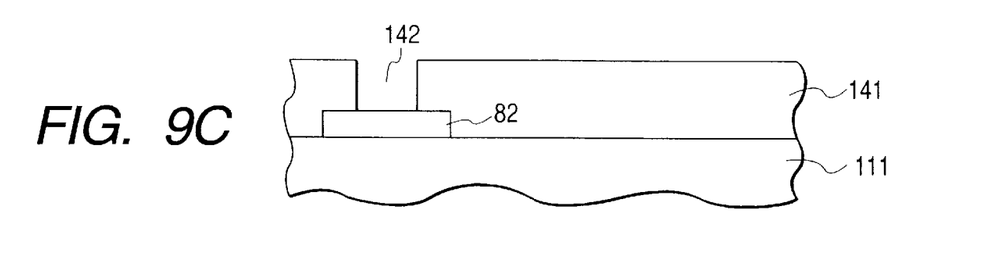
Figure 9D:
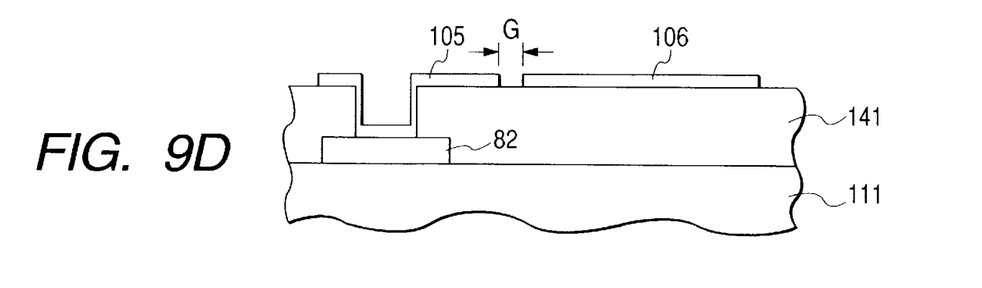

A photoresist pattern for forming the contact hole 142 was formed on the silicon oxide deposited in the above-mentioned step b, and the interlayer insulation film 141 was etched by using the photoresist pattern as a mask to form the contact hole 142. The etching was executed by RIE (reactive ion etching) using $CF_4$ and $H_2$ gas (FIG. 9C).

<Step d>

Thereafter, a pattern for forming the device electrode 105 and a gap G between the device electrodes was formed with photoresist (RD-2000N-41 produced by Hitachi Chemical Co.), and Ti of a thickness of 5 nm and Ni of a thickness of 100 nm were deposited in succession by vacuum evaporation. The photoresist pattern was dissolved with an organic solvent to lift off the Ni/Ti deposited films, thereby forming the device electrodes 105, 106 with a device electrode width of 300 μm and the gap G between the device electrodes of 30 μm.

<Step e>

Figure 10E:
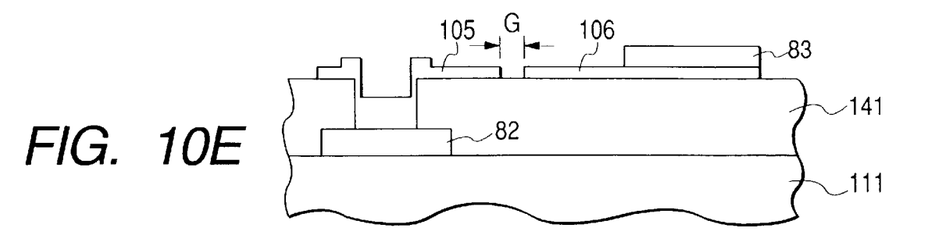
FIGS. 10E, 10F, 10G and 10H are view showing steps for producing the electron source shown in FIG. 7.

A photoresist pattern for the upper wiring 83 was formed on the device electrodes 105 and 106, then Ti of a thickness of 5 nm and Au of a thickness of 500 nm were deposited in succession by vacuum evaporation. Then the unnecessary portion was removed by lift off to form the upper wiring 83 of the desired shape (FIG. 10E).

<Step f>

Figure 10F:
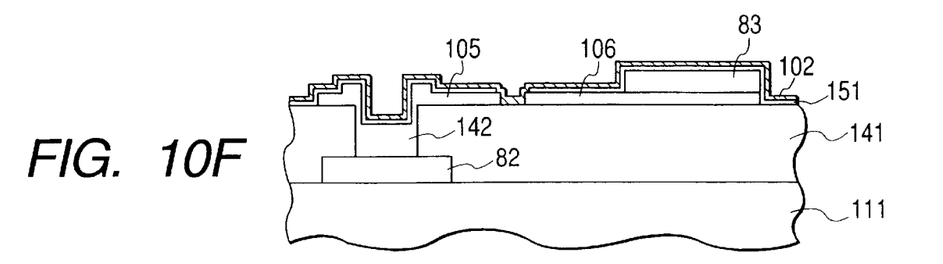

A Cr film 151 of a thickness of 100 nm was deposited by vacuum evaporation and patterned. Then a solution of Pd amine complex (trade name ccp4230 produced by Okuno Pharmaceutical Co.) was spin coated thereon and was subjected to a heating-baking treatment for 10 minutes at 300° C. Thus formed conductive film 102 for forming the electron emitting portion, composed of fine particles containing Pd as a main element, had a thickness of 8.5 nm and a sheet resistance of $3.9 \times 10^4$ Ω/□ (FIG. 10F).

<Step g>

Figure 10G:
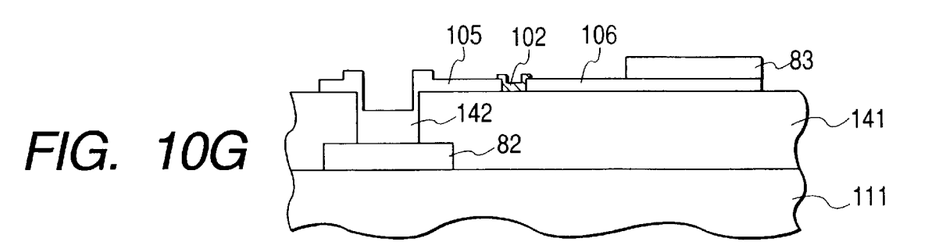

The Cr film 151 and the conductive film 102 for forming the electron emitting portion after baking were etched with an acid etchant to form a desired pattern (FIG. 10G).

<Step h>

Figure 10H:
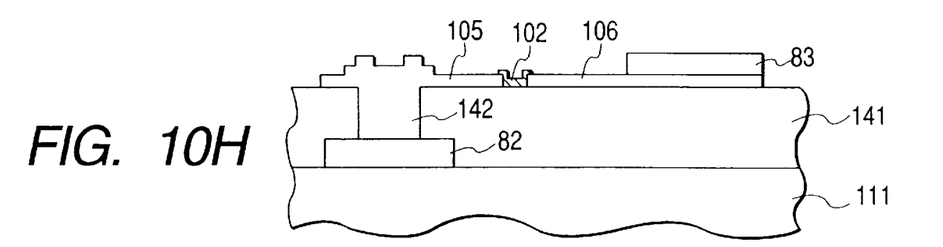

A photoresist pattern was formed so that the photoresist is applied a part other than the contact hole 142, and Ti of a thickness of 5 nm and Au of a thickness of 500 nm were deposited in succession by vacuum evaporation, and the unnecessary portion was removed by lift off to fill in the contact hole (FIG. 10H).

Through the above-described steps, there was formed, on the electron source substrate 111, an electron source 1 having the conductive films 102 for forming the plurality of electron emitting portions (100 rows×300 columns) which are wired in a simple matrix by the upper wirings 83 and the lower wirings 82.

Then a getter layer consisting of Zr and V was formed on the upper wirings by the gas deposition method under the same conditions as those of Example 1. The thickness of the getter layer was 20 μm.

<Step i>

Then the face plate 4 was formed in the following manner.

Figure 6A:
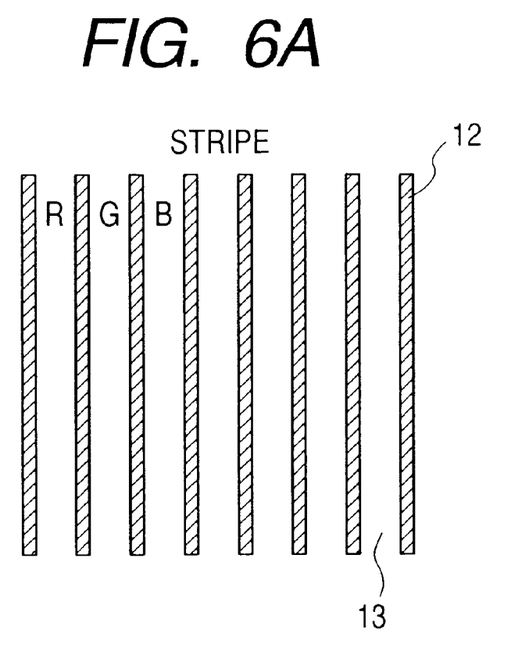
FIGS. 6A and 6B are views showing the structure of a fluorescent film.
Figure 6B:
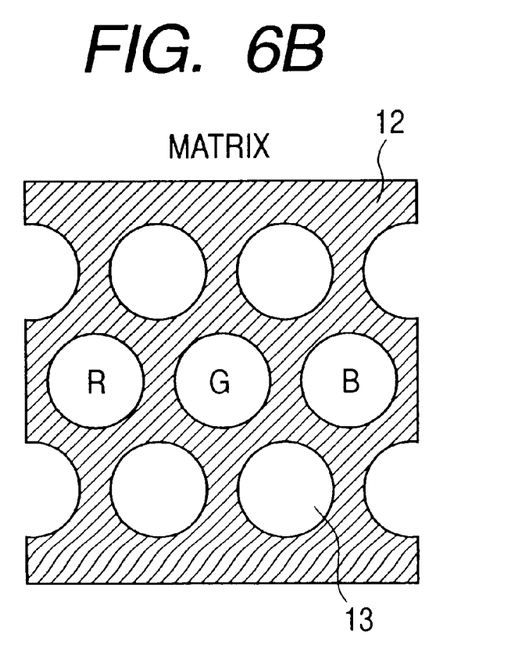

On the surface of a glass substrate 6, a fluorescent film 7 was formed by a printing method. The fluorescent film 7 was composed of fluorescent members (R, G, B) in stripes and black conductive materials (black stripes) 12 which were alternated, shown in FIG. 6A. Then, on the fluorescent film 7, a metal back layer 8 consisting of a thin Al film was formed with a thickness of 50 nm by sputtering.

<Step j>

Then the external container 5 shown in FIG. 5 was produced in the following manner.

The electron source 1 produced through the above-described steps was fixed to the rear plate 2, and then the supporting frame 3 and the aforementioned face plate 4 were combined. Next, the lower wirings 82 and the upper wirings 83 of the electron source 1 were respectively connected to the row selecting terminals, and then the signal input terminals, the electron source 1 and the face plate 4 were subjected to precise positional adjustment and were sealed to complete the external container 5. The sealing was executed by coating a frit glass on the face plate and the frame, then pre-baking the frit glass at 300° C. in the atmosphere, and then each member was combined and heated for 10 minutes at 410° C. in vacuum to bond them to each other.

Figure 11:
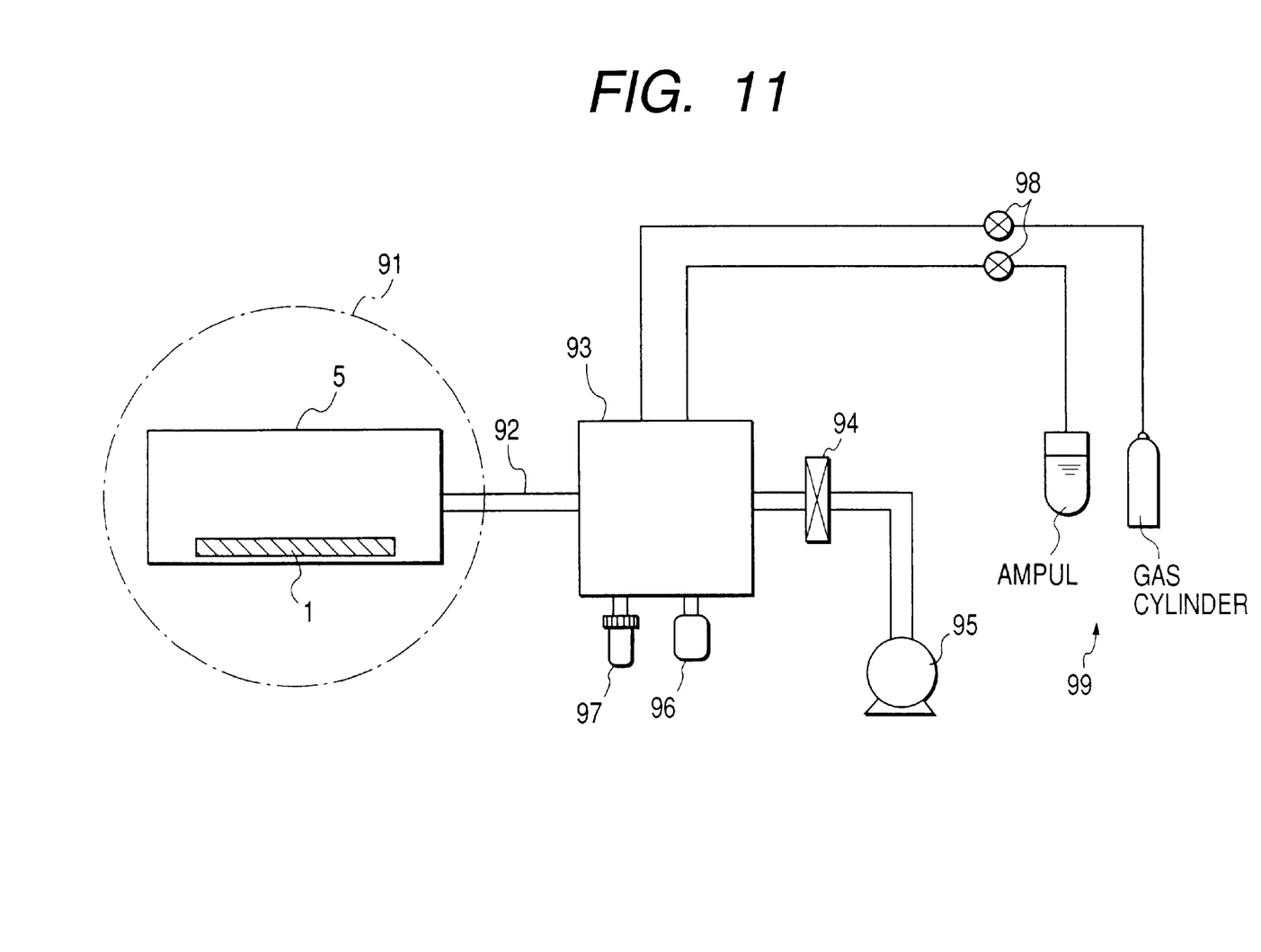
FIG. 11 is a schematic view showing a vacuum treatment apparatus employed for producing the image display apparatus.

Prior to the description of the next steps, there will be explained the vacuum apparatus employed in the next steps with reference to FIG. 11.

The image display apparatus 91 is connected through an exhaust pipe 92 to a vacuum container 93, and the vacuum container 92 is in turn connected to an evacuation apparatus 95 with a gate valve 94 therebetween. The vacuum container 93 is provided with a pressure gauge 96 and a quadrapole mass spectrometer (Q-mass) 97 for monitoring the internal pressure and the partial pressures of the remaining gasses. As the pressure and partial pressures in the external container 5 are difficult to measure directly, the pressure and partial pressures in the vacuum container 93 are measured and regarded as those in the external container 5. The evacuation apparatus 95 is an exhaust apparatus for ultra high vacuum consisting of a sorption pump and an ion pump. The vacuum container 93 is connected to a plurality of gas introduction devices, thereby enabling introduction of the substances provided in a substance source 99. The substance to be introduced is filled in a gas cylinder or an ampul depending on the kind of the substance, and the amount of introduction can be controlled by a gas introduction control means 98, which can be composed of a needle valve, a mass flow controller etc. depending on the kind, flow rate and required precision of control of the substance to be introduced. In the present example, the substance source 99 consisted of acetone (($CH_3$)$_2$CO) placed in a glass ampul, and the gas introduction control means consisted of a flow leak valve.

The following steps were executed with the above-described vacuum apparatus.

<Step k>

The interior of the external container 5 was evacuated to a pressure of $1\times10^{-3}$ Pa or less, and the following forming treatment was executed in order to form a plurality of electron emitting portions in the conductive film 102 provided on the electron source substrate 111 (FIG. 10H).

Figure 12:
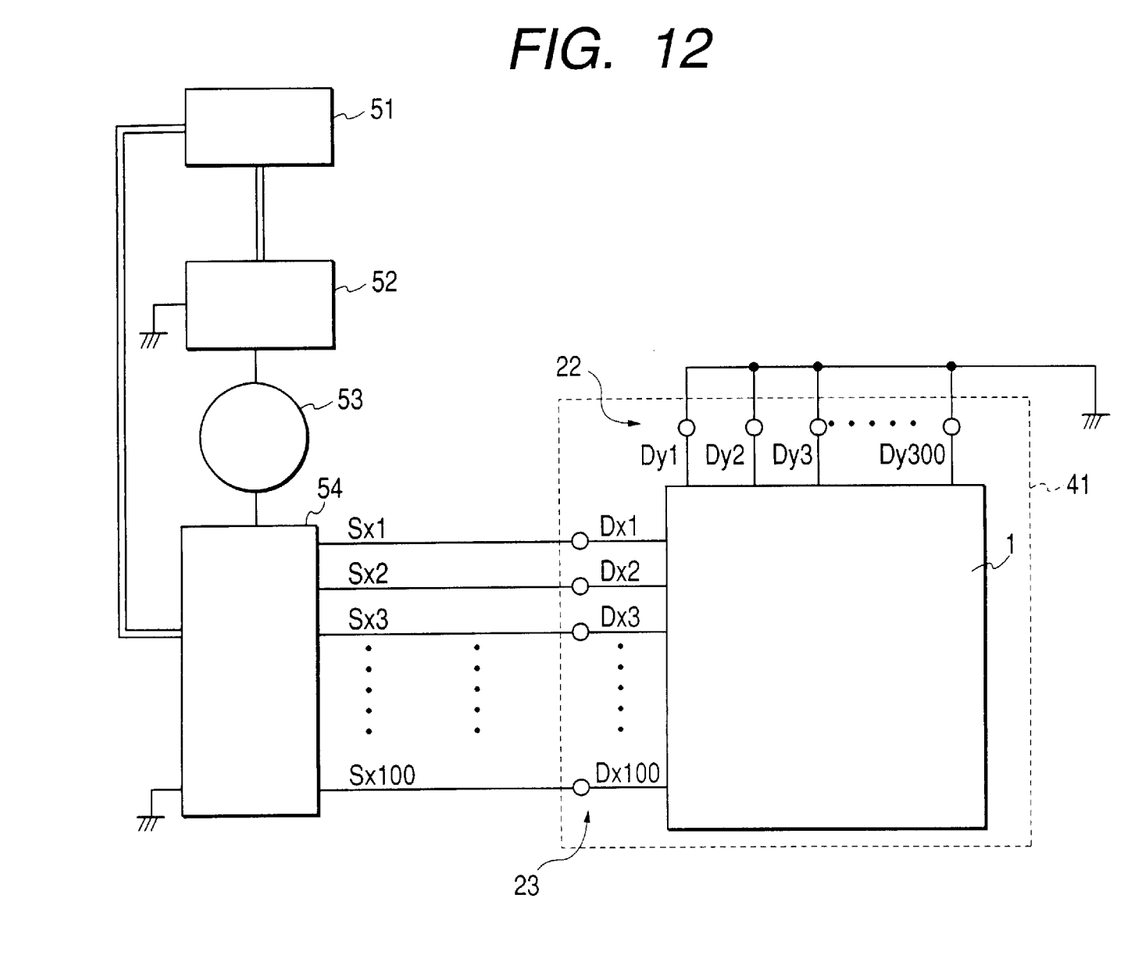
FIG. 12 is a schematic view showing the circuit constitution employed for the production steps, forming treatment and activating treatment of the image display apparatus.
Figure 13A:
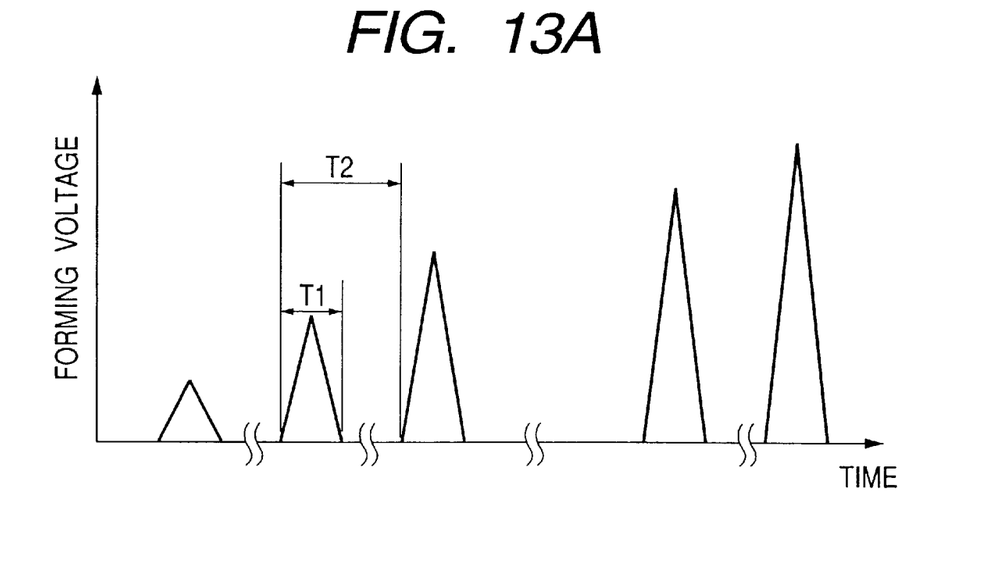
FIGS. 13A and 13B are graphs showing examples of wave forms of voltages applied at the time of the forming treatment.

The Y-direction wirings 22 are commonly connected and grounded as shown in FIG. 12, which is a schematic view showing the circuit constitution to be employed in the production, forming the activation of the image display apparatus. A control device 51 controls a pulse generator 52 and a line selection device 54. The line selection device 54 selects one of the X-direction wirings 22 and applies a pulse voltage thereto. The forming treatment was executed for each row (300 devices) in the X-direction. There were applied triangular pulses with gradually increasing wave height as shown in FIG. 13A, which had a pulse interval T1=1 msec and a pulse interval T2=10 msec. The resistance of each row was measured by inserting a rectangular pulse of a wave height of 0.1 V between the triangular pulses and measuring the current. The forming for one row was terminated when the resistance exceeded 3.3 kΩ (0.1 MΩ per device) and shifted to the next row. The above-described operation was repeated for all the rows to complete the forming operation for the entire conductive film (conductive film 102 for forming an electron emitting portion) to form the electron emitting portion in each conductive film, whereby obtained was the electron source 1 having a plurality of electron emitting devices of surface conduction type wired in a simple matrix arrangement.

<Step l>

Figure 13B:
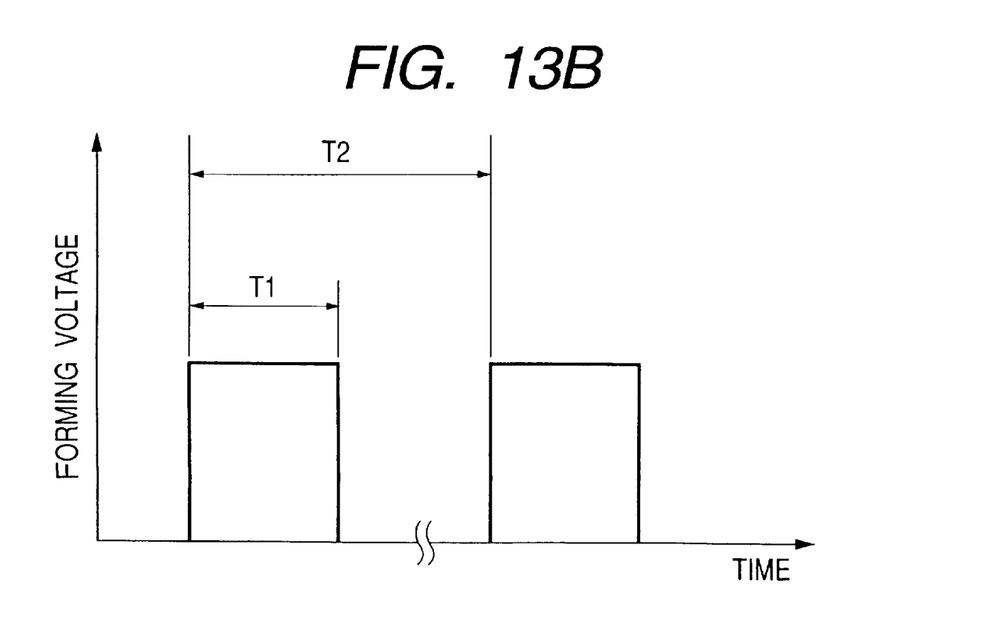

Acetone $(CH_3)_2CO$ and hydrogen $H_2$ were introduced into the vacuum container 93 with respective partial pressures of $1.3\times10^{-3}$ Pa and $1.3\times10^{-2}$ Pa, and the activation treatment of the electron emitting devices was executed by applying pulses to the electron source under the measurement of the device current. The pulse shape generated by the pulse generator 52 was rectangular pulses as shown in FIG. 13B, which had a wave height of 14 V, a pulse interval T1=100 μsec and a pulse interval T2=167 μsec. The line selection device 54 switched the selecting lines in succession from D×1 to D×100 with an interval of 167 μsec, whereby the device rows received the rectangular waves of T1=100 μsec and T2=16.7 msec, while the waves are shifted in phase in succession among the rows.

The ammeter 53 was used in a mode of detecting the averaged current when the rectangular pulse was turned on (in a state where the voltage was 14 V). The activation treatment was completed when the measured current reached 600 mA (2 mA per device), and the interior of the external container 5 was evacuated.

<Step m>

The image display apparatus 91 and the vacuum container 93 were maintained as a whole at 350° C. for 24 hours by a heating device, while the evacuating operation was continued. This treatment eliminated acetone and decomposed products thereof which might be adsorbed on the internal walls and the like of the external container 5 and the vacuum container 93, and activated the getter material provided on the rear plate.

<Step n>

The exhaust pipe was sealed off with a burner, after it was confirmed that an internal pressure became $1.3\times10^{-5}$ Pa or less.

The image display apparatus of the present example was completed in the above-described manner.

As explained in the foregoing, the getter formed by the gas deposition method and composed of ultra-fine particles or ultra-fine powder can adsorb the gas generated in the external container, thereby suppressing the deterioration in the characteristics of the electron emitting device, and suppressing the luminance reduction at the time of prolonged operation. Also, since the non-evaporative getter of the present invention can be formed by a low-temperature process, it can be directly formed in an arbitrary position with a high efficiency and without the use of an adhesive agent or the like, and without causing damage to other devices.

What is claimed is:

1. A process for forming a non-evaporative getter comprising the steps of:

generating metal particles by heating a metal or an alloy in an inert gas atmosphere in a particle generating chamber;

conveying the metal particles through a conveying pipe to a film forming chamber by a pressure difference; and discharging the metal particles onto a substrate to form the non-evaporative getter on the substrate.

2. The process according to claim 1, wherein a material for constituting the non-evaporative getter is composed of Zr or Ti, or an alloy containing at least one of Zr and Ti as a main component.

3. The process according to claim 2, wherein the alloy further contains at least one of elements Al, V and Fe as an auxiliary component.

4. A method of producing a non-evaporative getter for an image forming apparatus having an electron source, an image forming member, and a non-evaporative getter, which comprises:

forming said non-evaporative getter on a wiring or a black strip within the image forming apparatus by gas deposition.

5. A method of producing an image forming apparatus provided with an electron source, an image forming member for forming an image by irradiation with an electron beam emitted from the electron source, and a non-evaporative getter in a container, which comprises forming the non-evaporative getter on a substrate by generating metal principles by heating in an inert gas atmosphere in a particle generation chamber, conveying the metal particle through a conveying pipe to a film forming chamber by a pressure difference, and discharging the metal particles onto a substrate.

6. A method according to claim 5, wherein the non-evaporative getter is provided on a wiring or a black strip within the image forming apparatus.

7. The method according to claim 5, wherein the image forming member is a fluorescent member.

* * * * *

UNITED STATES PATENT AND TRADEMARK OFFICE
CERTIFICATE OF CORRECTION

PATENT NO. : 6,383,050 B1
DATED : May 7, 2002
INVENTOR(S) : Junri Ishikura et al.

It is certified that error appears in the above-identified patent and that said Letters Patent is hereby corrected as shown below:

Column 1,
Line 24, "effect" should read -- effective --;
Line 25, "to" should read -- on --; and "the" (third occurrence) should be deleted;
Line 28, "Also" should read -- Also, --;
Line 41, "an" should read -- a --; and
Lines 44 and 46, "plat" should read -- flat --.

Column 2,
Line 43, "Also" should read -- Also, --.

Column 3,
Lines 32, 37 and 44, "Also" should read -- Also, --;
Line 55, "includes" should read -- include --; and
Line 62, "evapor" should read -- vapor --.

Column 4,
Line 14, "can not" should read -- cannot --;
Lines 30 and 36, "Also" should read -- Also, --;
Lines 31 and 34, "afraid" should read -- feared --;
Line 33, "such" should read -- such a --; and
Line 35, "resulting" should read -- resulting in --.

Column 5,
Line 3, "lapis" should read -- lapse --;
Line 11, "forming" should read -- forming of --;
Line 55, "schematically" should read -- schematic --; and
Line 62, "view" should read -- views --.

Column 6,
Line 39, "following" should read -- following, --;
Line 63, "Also" should read -- Also, --; and
Line 65, "Consequently" should read -- Consequently, --.

Column 7,
Lines 1, 7 and 61, "Also" should read -- Also, --;
Line 28, "following" should read -- following, --; and
Line 64, "lead" should read -- leads --.

Column 8,
Line 44, "following" should read -- following, --.

UNITED STATES PATENT AND TRADEMARK OFFICE
CERTIFICATE OF CORRECTION

PATENT NO. : 6,383,050 B1
DATED : May 7, 2002
INVENTOR(S) : Junri Ishikura et al.

It is certified that error appears in the above-identified patent and that said Letters Patent is hereby corrected as shown below:

<u>Column 9,</u>
Line 1, "following" should read -- following, --.

<u>Column 10,</u>
Line 57, "ampul" should read -- ampule --; and
Line 64, "ampul," should read -- ampule, --.

<u>Column 12,</u>
Line 49, "prin-" should read -- particles --;
Line 50, "ciples" should be deleted; and
Line 51, "particle" should read -- particles --.

Signed and Sealed this

Twenty-sixth Day of November, 2002

Attest:

JAMES E. ROGAN
Attesting Officer  *Director of the United States Patent and Trademark Office*